(12) United States Patent
Ota

(10) Patent No.: US 10,411,708 B1
(45) Date of Patent: Sep. 10, 2019

(54) APPARATUSES AND METHODS INCLUDING CONFIGURABLE LOGIC CIRCUITS AND LAYOUT THEREOF

(71) Applicant: MICRON TECHNOLOGY, INC., Boise, ID (US)

(72) Inventor: Ken Ota, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/228,156

(22) Filed: Dec. 20, 2018

(51) Int. Cl.
  *H03K 19/173* (2006.01)
  *H03K 19/20* (2006.01)
  *G11C 11/407* (2006.01)

(52) U.S. Cl.
  CPC ..... *H03K 19/1735* (2013.01); *H03K 19/1737* (2013.01); *H03K 19/20* (2013.01); *G11C 11/407* (2013.01)

(58) Field of Classification Search
  CPC ...... H05K 1/0296; H05K 1/18; H01L 23/528; H01L 27/0203; H01L 27/0207
  See application file for complete search history.

(56) References Cited

U.S. PATENT DOCUMENTS

| | | | | |
|---|---|---|---|---|
| 2007/0077743 | A1* | 4/2007 | Rao | H01L 21/3086 438/595 |
| 2009/0166683 | A1* | 7/2009 | Vacula | H03K 19/1735 257/211 |
| 2009/0321791 | A1* | 12/2009 | Wagner | G06F 17/5068 257/207 |
| 2011/0204419 | A1* | 8/2011 | Johnson | H01L 21/76895 257/204 |
| 2011/0272776 | A1* | 11/2011 | Omura | H01L 27/0207 257/503 |
| 2012/0319185 | A1* | 12/2012 | Liang | H01L 27/11519 257/314 |
| 2013/0146982 | A1* | 6/2013 | Rashed | H01L 27/0207 257/368 |

* cited by examiner

*Primary Examiner* — Jason Crawford
(74) *Attorney, Agent, or Firm* — Dorsey & Whitney LLP

(57) ABSTRACT

Embodiments of the disclosure are drawn to apparatuses and methods for arranging configurable logic circuits such that the configurable logic circuit may be configured to form one or more of several logic circuits by coupling a combination of nodes included in the logic circuit. Configuring the configurable logic circuit may include modification of a single wiring layer.

9 Claims, 12 Drawing Sheets

US 10,411,708 B1

APPARATUSES AND METHODS INCLUDING CONFIGURABLE LOGIC CIRCUITS AND LAYOUT THEREOF

BACKGROUND

This disclosure relates generally to logic circuits, and more specifically to circuits in semiconductor devices. For example, logic circuits may be used in memory devices, including volatile memory, such as dynamic random access memory (DRAM). Data may be stored in individual memory cells of the DRAM. The memory cells may be organized in an array of rows and columns. Each memory cell in a row may be coupled to a word line and each memory cell in a column may be coupled to a bit line. Thus, every memory cell is coupled to a word line and a bit line. Logic circuits peripheral to the memory array may control various memory functions, for example, accessing one or more memory cells of the memory array to read data from or write data to the memory cells.

DETAILED DESCRIPTION

Figure 1:
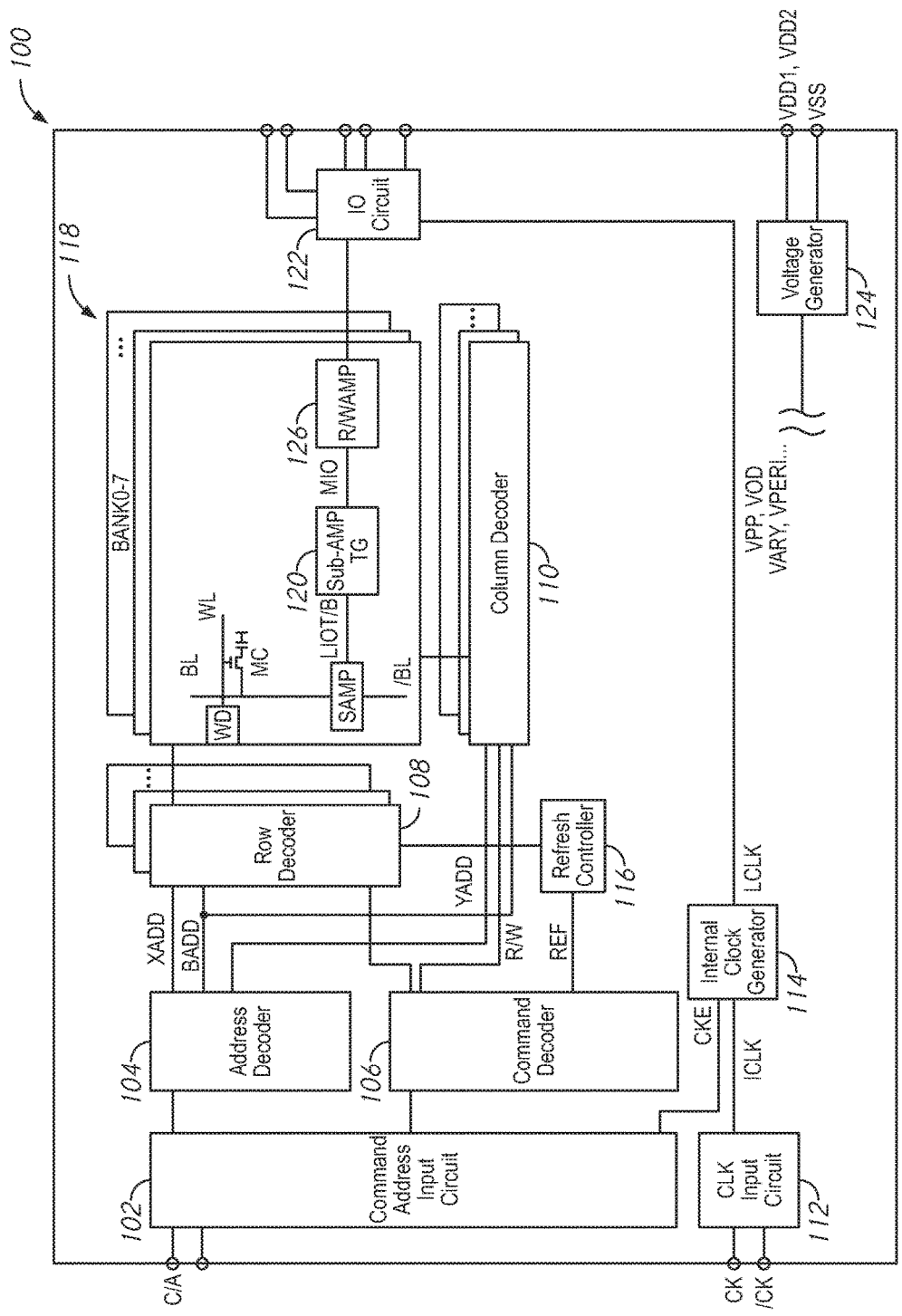
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Logic circuits may be used in a variety of devices, such as controllers and memory devices. For example, logic circuits peripheral to a memory array in a memory device (e.g., DRAM, FeRAM, STT-RAM, SRAM, etc.) may control various memory functions, for example, accessing one or more memory cells of the memory array to read data from or write data to the memory cells. During device design and/or manufacture, it may be determined that additional logic circuits (e.g., NAND, NOR, MUX, etc.) beyond those already designed (e.g., logic circuits in the peripheral circuits of a memory array) are required. Alternatively, it may be determined that different logic circuits are required. In some applications, it may be advantageous to include one or more configurable logic circuits with the designed logic circuits. The configurable logic circuit may be configured to act as one of several types of logic circuits (e.g., NAND, NOR, MUX, etc.). This may allow adjustments to the device later in the design and/or manufacturing process. For example, the configurable logic circuit may be configured for a desired logic function without the need to re-design all masks for the fabrication process (e.g., diffusion layer mask, gate layer mask, etc.).

As described herein, configurable logic circuits may be configured by changing a metal wiring pattern without multiple mask redesigns. The configurable logic circuits may include a plurality of nodes for coupling with a wiring layer. The nodes may be arranged in groups (e.g., lines) and ordered within the groups. The arrangement of the nodes may allow the plurality of nodes, or a sub-set of the plurality of nodes, to be coupled in various combinations to configure the configurable logic circuit as one of several types of logic circuits. For purposes of illustration, reference will be made to configurable logic circuits used in the peripheral circuits of a semiconductor device including DRAM. However, the configurable logic circuits described herein are not limited to this specific application. For example, the configurable logic circuits may be included in other memory types (e.g., FeRAM, STT-RAM, etc.) and/or other devices (e.g., controllers, processors).

FIG. 1 is a block diagram showing an overall configuration of a semiconductor device 100 according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or /BL is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which provides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD1, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands by be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL.

The device 100 may receive an access command which is a read command. When a read command is received, and a bank address, a row address and a column address are timely supplied with the read command, read data is read from memory cells MC in the memory array 118 corresponding to the row address and column address. The read command is received by the command decoder 106 (e.g., command controller), which provides internal commands so that read data from the memory array 218 is provided to the read amplifier 128. The read data is output to outside from the data terminals DQ via the input/output circuit 122.

The device 100 may receive an access command which is a write command. When the write command is received, and a bank address, a row address and a column address are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal is provided to the refresh controller 116. A refresh command provided to the refresh controller 116 may cause the device 100 to carry out refresh operations for one or more of the memory banks.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, VPERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

One or more of the circuits previously described that are peripheral to the memory array 118, for example, decoders, controllers, etc. may be included in the semiconductor device 100 as peripheral circuitry.

Figure 2:
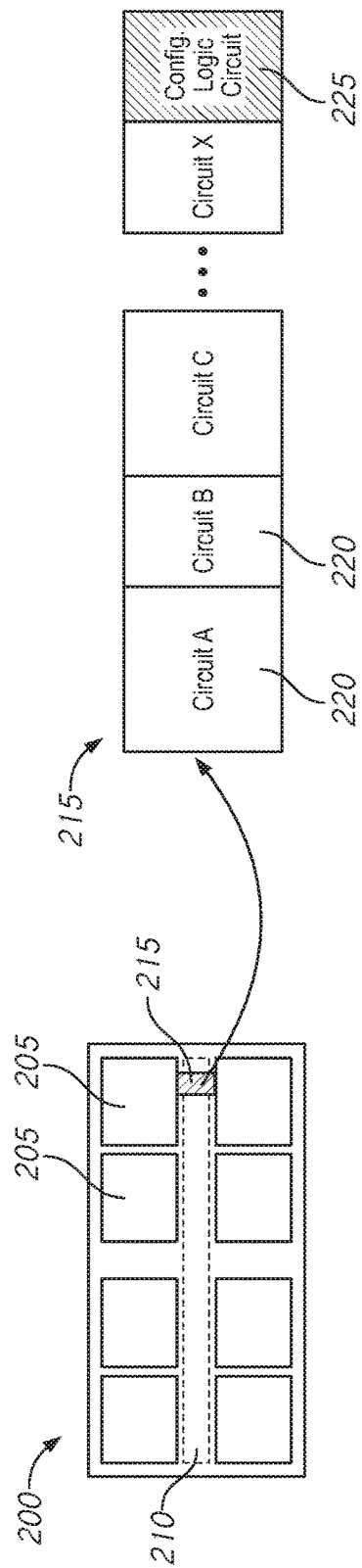
FIG. 2 is a block diagram of a layout for a semiconductor device according to an embodiment of the present disclosure.

FIG. 2 is a block diagram of a layout for a semiconductor device 200 according to an embodiment of the present disclosure. In some embodiments, the layout for the device 200 may be used for device 100 or a portion of device 100 shown in FIG. 1. The device 200 may include one or more memory arrays 205. The device 200 may include a peripheral region 210, located peripheral to the memory arrays 205. The peripheral region 210 may include peripheral circuitry 215 coupled to one or more memory array 205. The peripheral circuitry 215 may include one or more circuits 220. The circuits 220 may include logic circuits in some embodiments. In some embodiments of the disclosure, the peripheral region 210 include one or more of the circuits previously described with reference to FIG. 1, for example, decoders, controllers, etc. The peripheral circuitry 215 may include one or more configurable logic circuits 225. Although the circuits 220 are shown in a series in FIG. 2, the circuits 220 of peripheral circuitry 215 may have alternative physical arrangements (e.g., parallel, grid). Furthermore, the configurable logic circuit 225 may be interspersed with the circuits 220 rather than at an edge of the peripheral circuitry 215.

Figure 3:
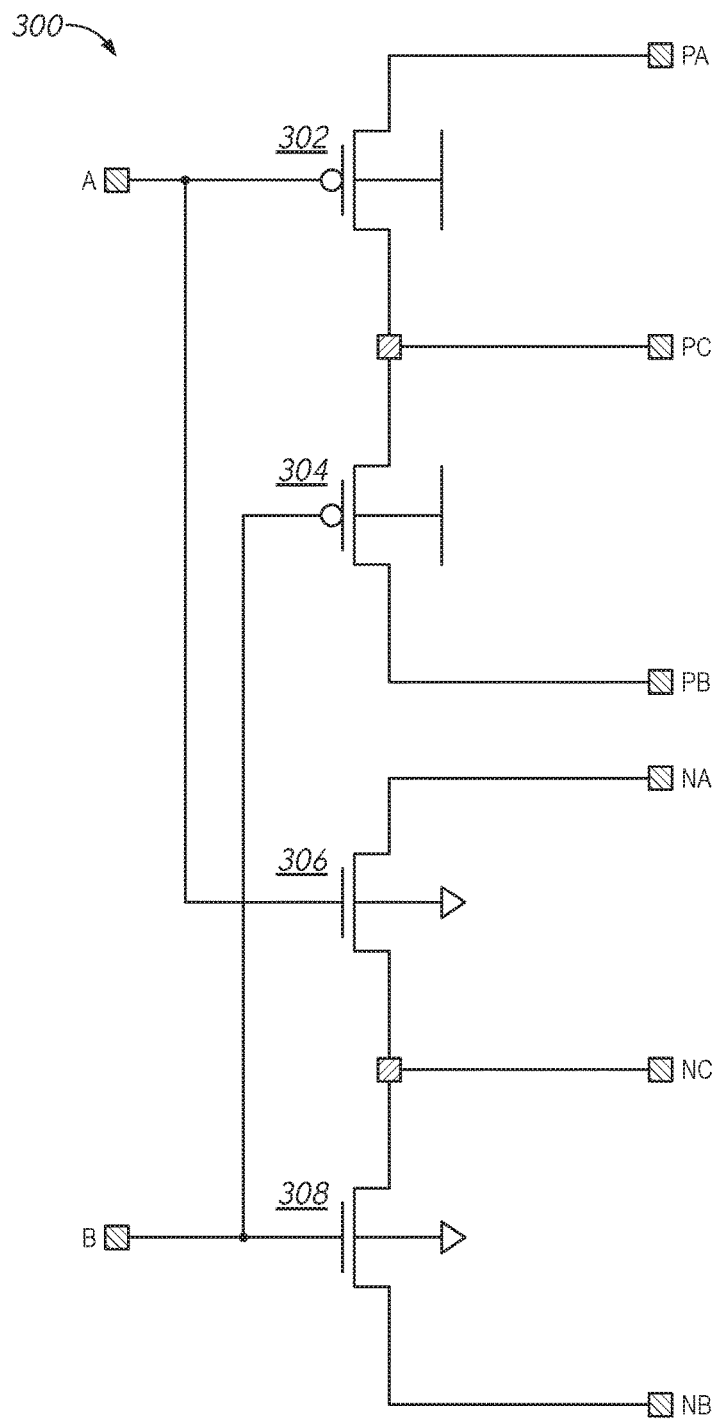
FIG. 3 is a circuit diagram of a configurable logic circuit according to an embodiment of the disclosure.

FIG. 3 is a circuit diagram of a configurable logic circuit 300 according to an embodiment of the disclosure. The configurable logic circuit 300 may be used to implement the configurable logic circuit 225 of FIG. 2 in some embodiments. The configurable logic circuit 300 may include a first P-channel transistor 302, a second P-channel transistor 304, a first N-channel transistor 306, and a second N-channel transistor 308. The gates of the first P-channel transistor 302 and the first N-channel transistor 306 may be coupled to node A. The gates of the second P-channel transistor 304 and the second N-channel transistor may be coupled to node B. One of the source or drain of the first P-channel transistor 302 may be coupled to node PA. The other of the source or drain of the first P-channel transistor 302 and one of the source or drain of the second P-channel transistor 304 may be coupled to node PC. The other of the source or drain of the second P-channel transistor 304 may be coupled to the node PB. One of the source or drain of the first N-channel transistor 306 may be coupled to node NA. The other of the source or drain of the first N-channel transistor 306 and one of the source or drain of the second N-channel transistor 308 may be coupled to node NC. Finally, the other of the source or drain of the second N-channel transistor 308 may be coupled to the node NB. As will be described in more detail in reference to the following figures, the nodes of the configurable logic circuit 300 may be coupled in various combinations to form a desired logic circuit (e.g., inverter, NAND, NOR, multiplexer) or disabled if unneeded.

Figure 4:
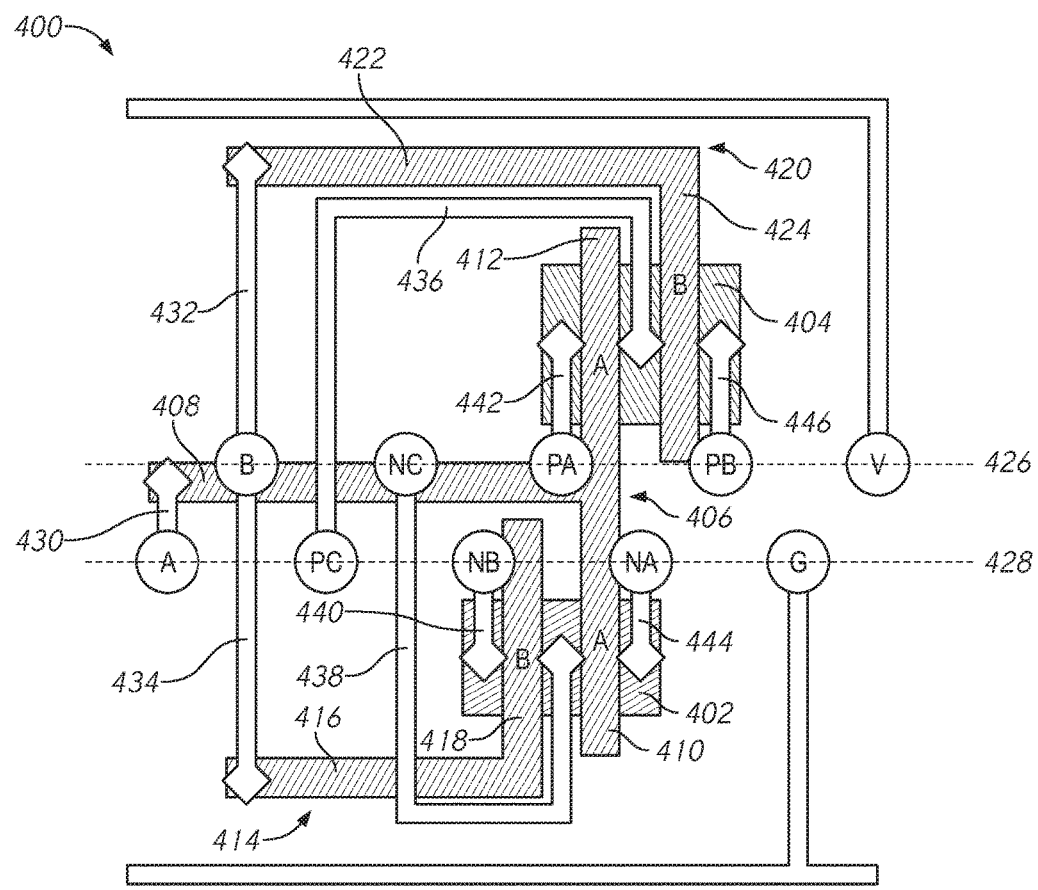
FIG. 4 is a layout diagram of the configurable logic circuit shown in FIG. 3 according to an embodiment of the disclosure.

FIG. 4 is a layout diagram 400 of the configurable logic circuit 300 according to an embodiment of the disclosure. The layout diagram 400 illustrates how the configurable logic circuit 300 may be arranged on a semiconductor die in some embodiments. The layout diagram 400 shows the arrangement of nodes A, B, PC, NC, NB, PA, NA, and PB that were described in reference to FIG. 3. The layout of the configurable logic circuit 300 may allow the nodes to be arranged such that the order of the nodes coupled to the P-channel transistors 302, 304 are opposite the order of the nodes coupled to the N-channel transistors 306, 308. That is, from left-to-right, node PA comes before node PB and node NB comes before node NA. The layout shown in FIG. 4 may allow node PC and node NC to be ordered before nodes PA and PB and nodes NB and NA, respectively, from left-to-right. The layout may allow node A and node B, which are coupled to the gates of the transistors of configurable logic circuit 300, to be ordered before the nodes coupled to the sources and/or drains of the transistors of configurable logic circuit 300.

As shown in layout diagram 400, the configurable logic circuit 300 may include a diffusion layer that includes an N-region 402 and a P-region 404. A gate wiring layer may be included adjacent to the diffusion layer. The gate layer may include a first section 406 having a T-shape (e.g., "T-shape 406"). The T-shape 406 may include a stem 408 and an arm having a first portion 410 and a second portion 412. At least a part of the stem 408 may extend between the N-region 402 and the P-region 404. At least a part of the first portion 410 of the arm may extend over the N-region 402 and at least a part of the second portion 412 of the arm may extend over the P-region 404.

The gate wiring layer may include a second section 414 having an L-shape (e.g., "first L-shape 414"). The first L-shape 414 may include a stem 416 and an arm 418. At least a portion of the stem 416 of the first L-shape 414 may extend parallel to the stem 408 of the T-shape 406. At least a portion of the arm 418 of the first L-shape 414 may extend over the N-region 402 in a direction that is parallel to the first portion 410 of the arm of the T-shape 406. The arm 418 may be located on a side of the first portion 410 of the arm that is proximal to the stem 408 of the T-shape 406. The gate wiring layer may include a third section 420 having an L-shape (e.g., "second L-shape 420). The second L-shape 420 may include a stem 422 and an arm 424. At least a portion of the stem 422 of the second L-shape 420 may extend parallel to the stem 408 of the T-shape 406. At least a portion of the arm 422 of the second L-shape 420 may extend over the P-region 404 in a direction that is parallel to the second portion 412 of the arm of the T-shape 406. The arm 424 may be located on a side of the second portion 412 of the arm that is distal to the stem 408 of the T-shape 406.

A wiring layer may be included adjacent to the gate wiring layer such that the gate wiring layer is disposed between the wiring layer and the diffusion layer. The wiring layer may include the nodes of the configurable logic circuit 300 coupled to portions of the gate wiring layer and diffusion layer. In some embodiments, one or more of the nodes may be disposed along a line or lines. For example, in the embodiment shown in FIG. 4, some of the nodes may be disposed along a first line indicated by line 426 and some of the nodes may be disposed along a second line indicated by line 428. In some embodiments line 426 and 428 are parallel. In some embodiments, line 426 runs along the stem 408 of the T-shape 406. In the embodiment illustrated in FIG. 4, node B, node NC, node PA, and node PB are included along the first line 426 while node A, node PC, node NB, and node NA are included along the second line 428. In some embodiments, the nodes alternate between the first line 426 and the second line 428. For example, in the embodiment shown in FIG. 4, the nodes alternate starting with node A along the second line 428, node B along the first line 426, node PC along the second line 428, node NC along the first line 426, and so on for nodes NB, PA, NA, and PB. Alternating the nodes between the first and second lines may provide greater area for a corresponding conductive contact for each of the nodes. In some embodiments, such as the one shown in FIG. 4, the order of the nodes coupled to the diffusion regions, N-region 402 and P-region 404, are swapped between lines 426 and 428. In line 426, from left-to-right, node PA comes before PB. In contrast, in line 428, from left-to-right, node NB comes before node NA.

In some embodiments, the wiring layer further includes a node V that may be coupled to a voltage source (not shown). In the embodiment shown in FIG. 4, node V is arranged along line 426. In some embodiments, the wiring layer further includes a node G that may be coupled to a ground (not shown). In the embodiment shown in FIG. 4, node G is arranged along line 428.

Referring to both FIG. 3 and FIG. 4, node A is coupled to the stem 408 of the T-shape 406 of the gate wiring layer. This may couple node A to the gates of the first P-channel transistor 302 and the first N-channel transistor 306. In some embodiments, such as the one shown in FIG. 4, a straight segment 430 of the wiring layer may couple node A to the gate wiring layer to place node A along line 428. Node B is coupled to stem 416 of the first L-shape 414 and the stem 422 of the second L-shape 420 of the gate wiring layer. This may couple node B to the gates of the second P-channel transistor and the second N-channel transistor. In some embodiments, such as the one shown in FIG. 4, two straight segments 432, 434 of the wiring layer may couple node B to the gate wiring layer to place node B along line 426. In some embodiments, other wiring arrangements may be used to place node A and node B along line 428 and line 426, respectively.

Node PC may be coupled to the P-region 404 between the second portion 412 of the arm of the T-shape 406 and the arm 424 of the second L-shape 420. This may couple node PC to the source or drain of the first P-channel transistor 302 and the source or drain of the second P-channel transistor 304. In some embodiments, such as the one shown in FIG. 4, node PC may be coupled to the P-region 404 by a J-shaped segment 436 of the wiring layer place node PC along line 428 and ordered between node A and node NB. Node NC may be coupled to the N-region 402 between the first portion 410 of the arm of the T-shape 406 and the arm 418 of the first L-shape 414. This may couple node NC to the source or drain of the first N-channel transistor 306 and the source or drain of the second N-channel transistor 308. In some embodiments, such as the one shown in FIG. 4, node NC may be coupled to the N-region 402 by a J-shaped segment 438 of the wiring layer place node NC along line 426 and ordered between node B and node PA. In other embodiments, other wiring arrangements may be used to place node PC and node NC. For example, an L-shape segment may be used in some embodiments.

Node NB may be coupled to the N-region 402 adjacent to the arm 418 of the first L-shape 414. This may couple node NB to the source or drain of the second N-transistor 308. In some embodiments, such as the one shown in FIG. 4, a straight segment 440 of the wiring layer may couple node NB to the N-region 402. The straight segment 440 may allow node NB to be placed along line 428. Node PA may be coupled to the P-region 404 adjacent to the second portion 412 of the arm of the T-shape 406. This may couple node PA to the source or drain of first P-channel transistor 302. In some embodiments, such as the one shown in FIG. 4, a straight segment 442 of the wiring layer may couple node PA to the P-region 404. The straight segment 442 may allow node PA to be placed along line 426.

Node NA may be coupled to the N-region 402 adjacent to the first portion 410 of the arm of the T-shape 406. This may couple node NA to the source or drain of first N-channel transistor 306. In some embodiments, such as the one shown in FIG. 4, a straight segment 444 of the wiring layer may couple node NA to the N-region 402. The straight segment 444 may allow node NA to be placed along line 428. Node PB may be coupled to the P-region 404 adjacent to the arm 424 of the second L-shape 420. This may couple node PB to the source or drain of the second P-channel transistor 304. In some embodiments, such as the one shown in FIG. 4, a straight segment 446 of the wiring layer may couple node PB to the P-region 404. The straight segment 446 may allow node PB to be placed along line 426.

The layout of the layers and nodes shown in FIG. 4 may allow the configurable logic circuit 300 to be configured as one of several logic circuits (e.g., inverter, NAND, NOR, multiplexer) by coupling various combinations of nodes with only a wiring layer. In the embodiment shown in FIG. 4, the nodes may be connected without crossing wires to configure the configurable logic circuit 300. Crossing wires to connect various nodes would necessitate two or more wiring layers, thus increasing circuit and fabrication complexity.

Variations of the layout shown in FIG. 4 may be possible. For example, straight segments 440, 442, 444, and 446 may be eliminated to shift nodes NB, PA, NA and PB over the corresponding P-region 404 and N-region 402. Straight segment 430 and J-shaped segment 436 may be lengthened to align node A and node PC with nodes NB and NA. Straight segment 432 may be shortened and straight segment 434 may be lengthened to align node B with nodes PA and PB. J-shaped segment 438 may be lengthened to align node NC with nodes PA and PB. In another example, node PC may be placed along line 426 and node NC may be placed along line 428. In another example, node A may be placed along line 426 and node B may be placed along line 428. In another example, node A and node B may both be placed along either line 426 or line 428. In a further example, node A and node B may be placed along a third line (not shown), adjacent to line 426, adjacent to line 428, or between line 426 and line 428.

Figure 5:
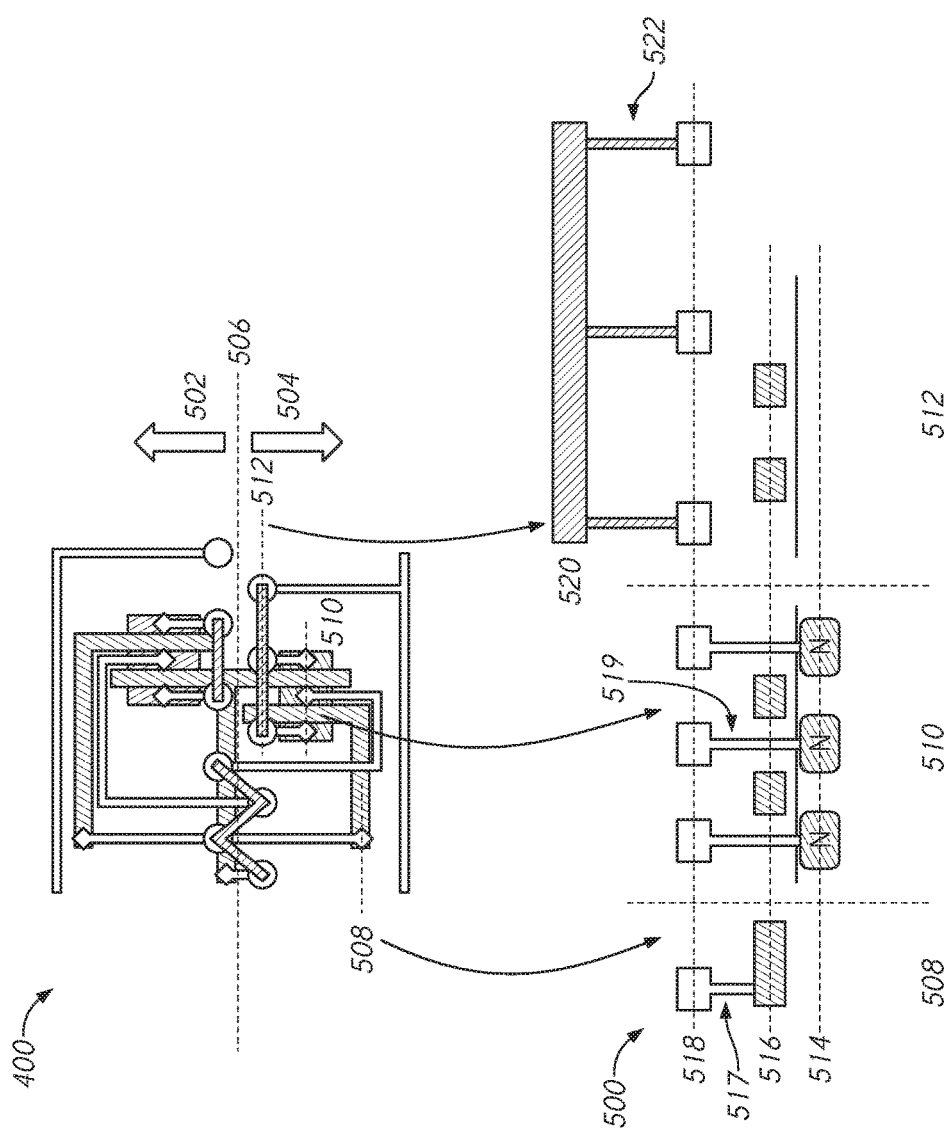
FIG. 5 includes the layout diagram of FIG. 4 along with a cross-sectional view of the layout diagram according to an embodiment of the disclosure.

FIG. 5 includes the layout diagram 400 of FIG. 4 along with a cross-sectional view 500 of the layout diagram according to an embodiment of the disclosure. In the example shown in FIG. 5, the configurable logic circuit 300 is configured to be disabled, as described in more detail with reference to FIG. 10. As shown in FIG. 5, layout diagram 400 may be divided into a PMOS side 502 and an NMOS side 504 as delineated by line 506. PMOS side 502 may include P-region 404 and NMOS side 504 may include N-region 402. Cross-sectional view 500 illustrates side views of the configurable logic circuit 300 along different cuts in the NMOS side 504 indicated by lines 508, 510, and 512. Although only side views of the NMOS side 504 are shown, it is understood that corresponding side views of the PMOS side 502 may look substantially similar in some embodiments.

In the portion of side view 500 taken along line 508, the wiring layer 518 can be seen adjacent to the gate wiring layer 516. In some embodiments, the wiring layer 518 may be coupled to the gate wiring layer 516 by one or more vias 517. In some embodiments, the gate wiring layer 516 may include a poly-silicon and/or metal (e.g., W, Ti, TiN). In some embodiments, the wiring layer 518 may include a metal (e.g., W, Al, Cu).

In the portion of cross-sectional view 500 taken along line 510, the diffusion layer 514 including N-region 402 is shown adjacent to the gate wiring layer 516. The gate wiring layer 516 may be disposed between the diffusion layer 514 and the wiring layer 518. In some embodiments, diffusion layer 514 may include doped silicon. The silicon may be doped with one or more elements to provide N-region 402 (e.g., As, P, or B). In some embodiments, nodes of the wiring layer 518 may be coupled to the diffusion layer 514 by one or more vias 519.

In the portion of side view 500 at line 512, a second wiring layer 520 is provided adjacent to wiring layer 518. Second wiring layer 520 may include a metal (e.g., W, Al, Cu) in some embodiments. The second wiring layer 520 may be coupled to nodes of the wiring layer 518 by vias 522 in some embodiments. Although not shown in FIG. 5, additional layers may be disposed between the illustrated layers. For example, a non-conductive layer may be disposed between the wiring layer 518 and the second wiring layer 520. In another example, a non-conductive layer may be disposed between the gate wiring layer 516 and the wiring layer 518.

The second wiring layer 520 may be coupled to various nodes of wiring layer 518 to configure the configurable logic circuit to act as one of several logic circuits. As discussed with reference to FIG. 4, the nodes may be connected without crossing wires. Thus, only wiring layer 520 requires modification during design and/or fabrication to provide a desired logic circuit.

Figure 6:
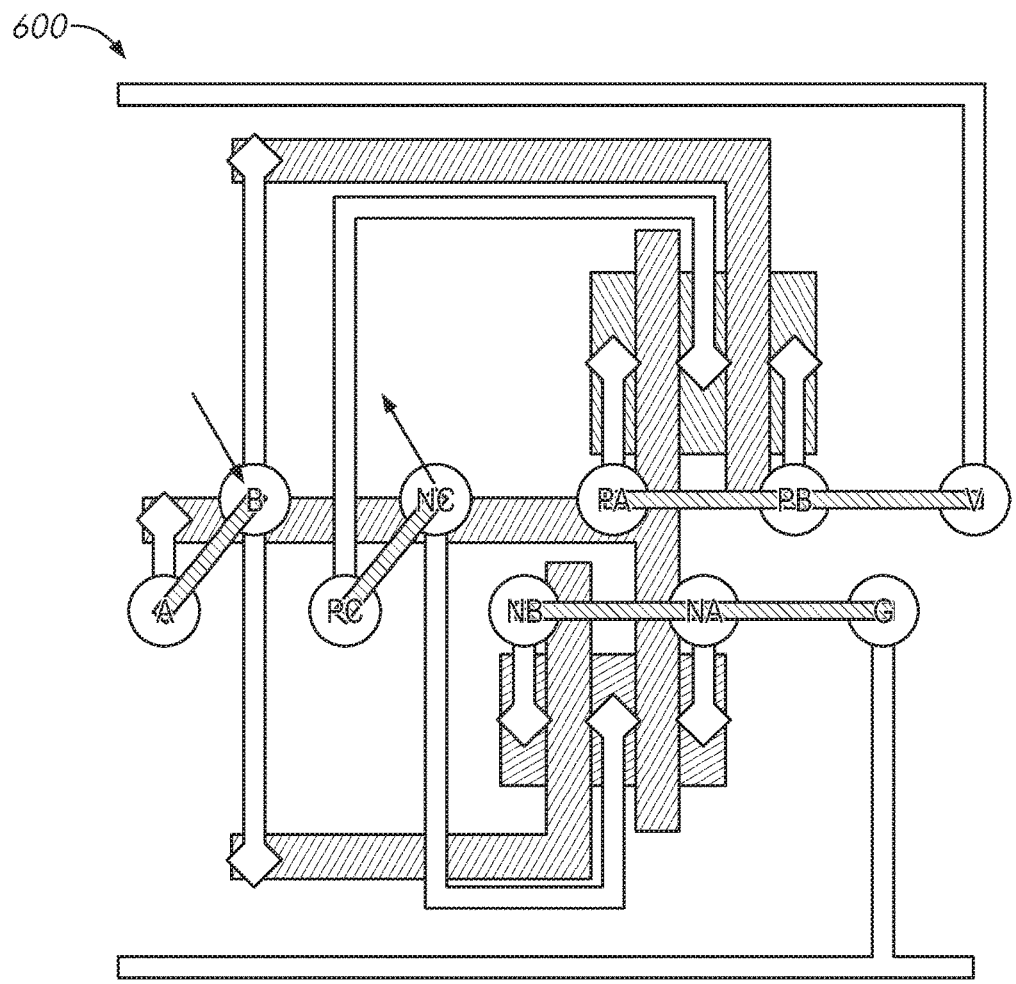
FIG. 6 is a layout diagram illustrating the configurable logic circuit configured as an inverter circuit according to an embodiment of the disclosure.

FIG. 6 is a layout diagram illustrating the configurable logic circuit 300 configured as an inverter circuit 600 according to an embodiment of the disclosure. As shown in FIG. 6, second wiring layer 520 may couple (e.g., form a conductive path between) node A to node B. Second wiring layer 520 may further couple node PC to node NC. Node PA and node PB may be coupled to a voltage source at node V by second wiring layer 520. Node NB and node NA may be coupled to a ground at node G by second wiring layer 520. In this configuration, node B may act as an input to the inverter circuit 600 and node NC may act as an output of the inverter circuit 600.

Figure 7:
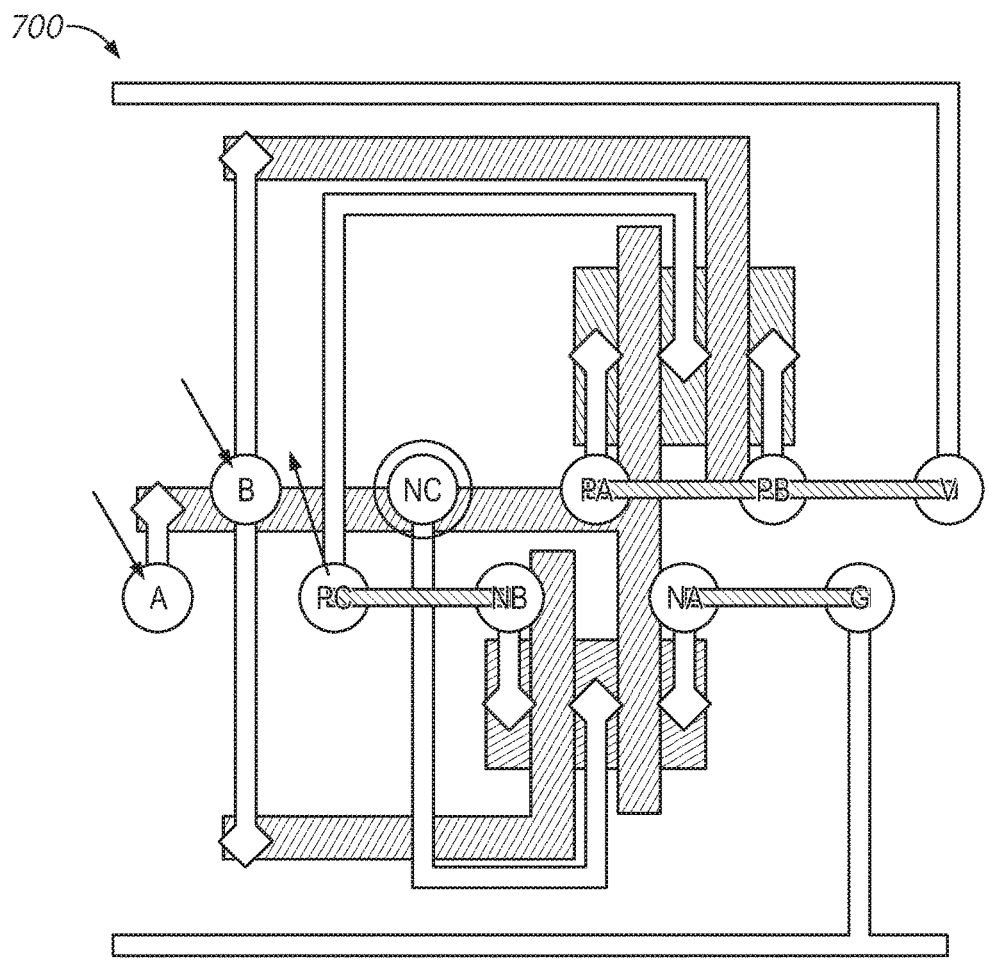
FIG. 7 is a layout diagram illustrating the configurable logic circuit configured as an NAND circuit according to an embodiment of the disclosure.

FIG. 7 is a layout diagram illustrating the configurable logic circuit 300 configured as a NAND circuit 700 according to an embodiment of the disclosure. Second wiring layer 520 may couple node PC to node NB. Node PA and node PB may be coupled to a voltage source at node V by second wiring layer 520. Node NA may be coupled to ground at node G by second wiring layer 520. Node NC may not be utilized. Node A and node B may act as inputs to the NAND circuit 700 and node PC may act as an output to the NAND circuit 700.

Figure 8:
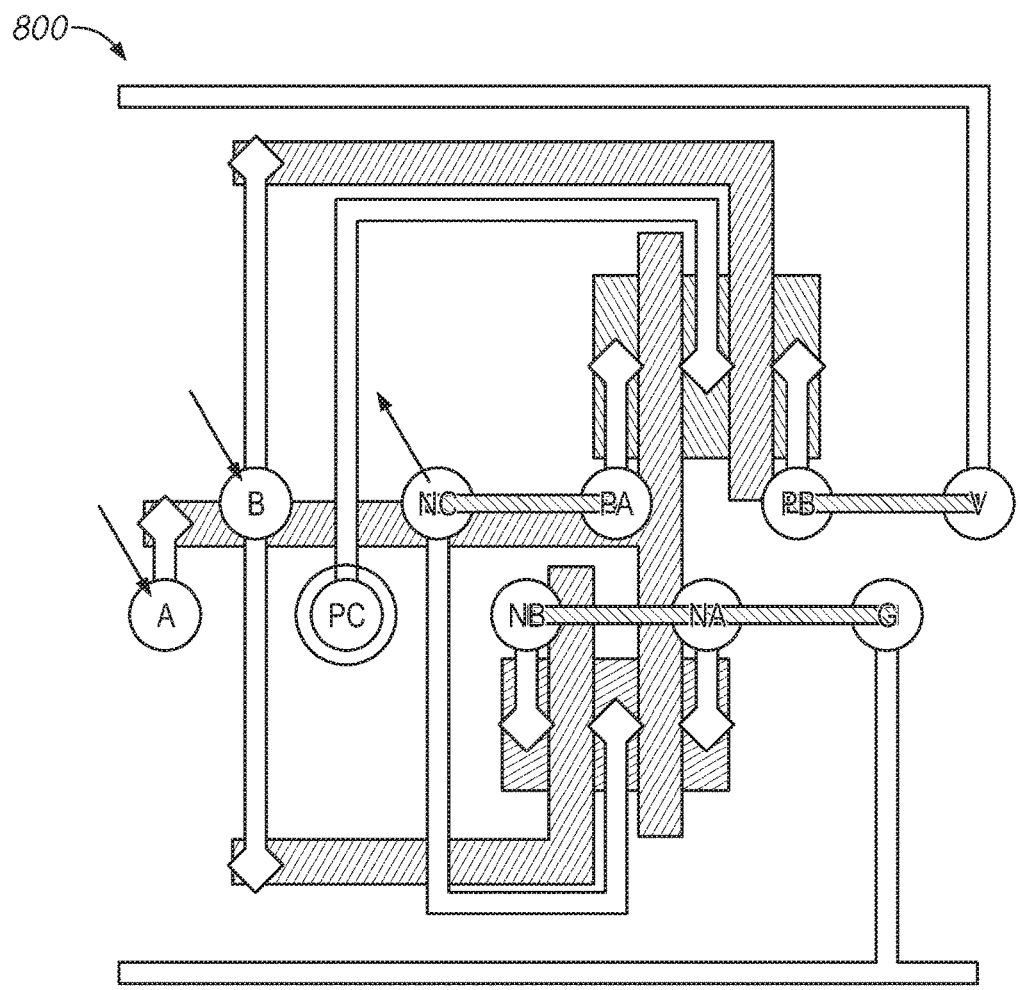
FIG. 8 is a layout diagram illustrating the configurable logic circuit configured as an NOR circuit according to an embodiment of the disclosure.

FIG. 8 is a layout diagram illustrating the configurable logic circuit 300 configured as a NOR circuit 800 according to an embodiment of the disclosure. Second wiring layer 520 may couple node NC to node PA. Node PB may be coupled to a voltage source at node V by second wiring layer 520. Node NB and node NA may be coupled to ground at node G by second wiring layer 520. Node PC may not be utilized. Node A and node B may act as inputs to the NOR circuit 800 and node NC may act as an output to the NOR circuit 800.

Figure 9:
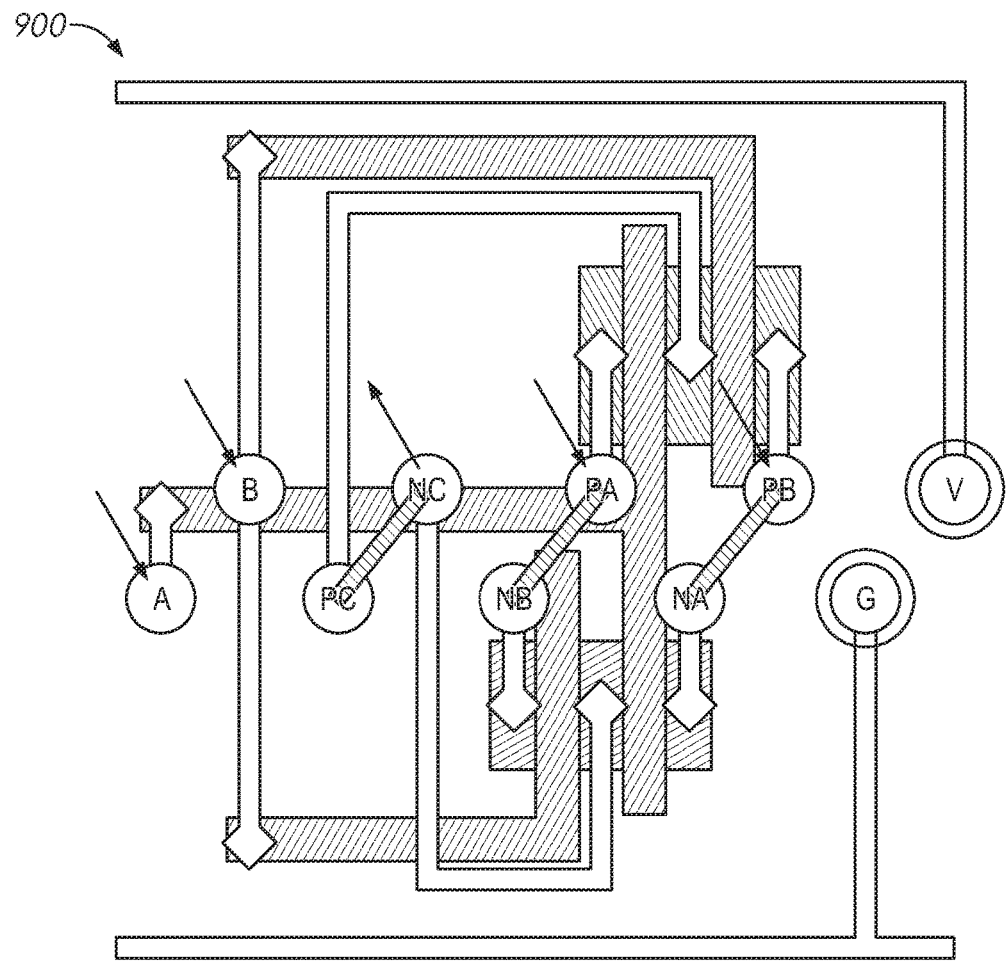
FIG. 9 is a layout diagram illustrating the configurable logic circuit configured as an multiplexer circuit according to an embodiment of the disclosure.

FIG. 9 is a layout diagram illustrating the configurable logic circuit 300 configured as a multiplexer circuit 900 according to an embodiment of the disclosure. Node PC may be coupled to node NC by second wiring layer 520. Node NB may be coupled to node PA by second wiring layer 520. Node NA and node PB may be coupled by wiring layer 520. Node A, node B, node PA, and node PB may act as inputs to the multiplexer. Node A and node B may provide selection control signals whereas node PA and node PB provide signals to be selected for output by the multiplexer circuit 900. Node NC may act as an output to the multiplexer circuit 900.

Figure 10:
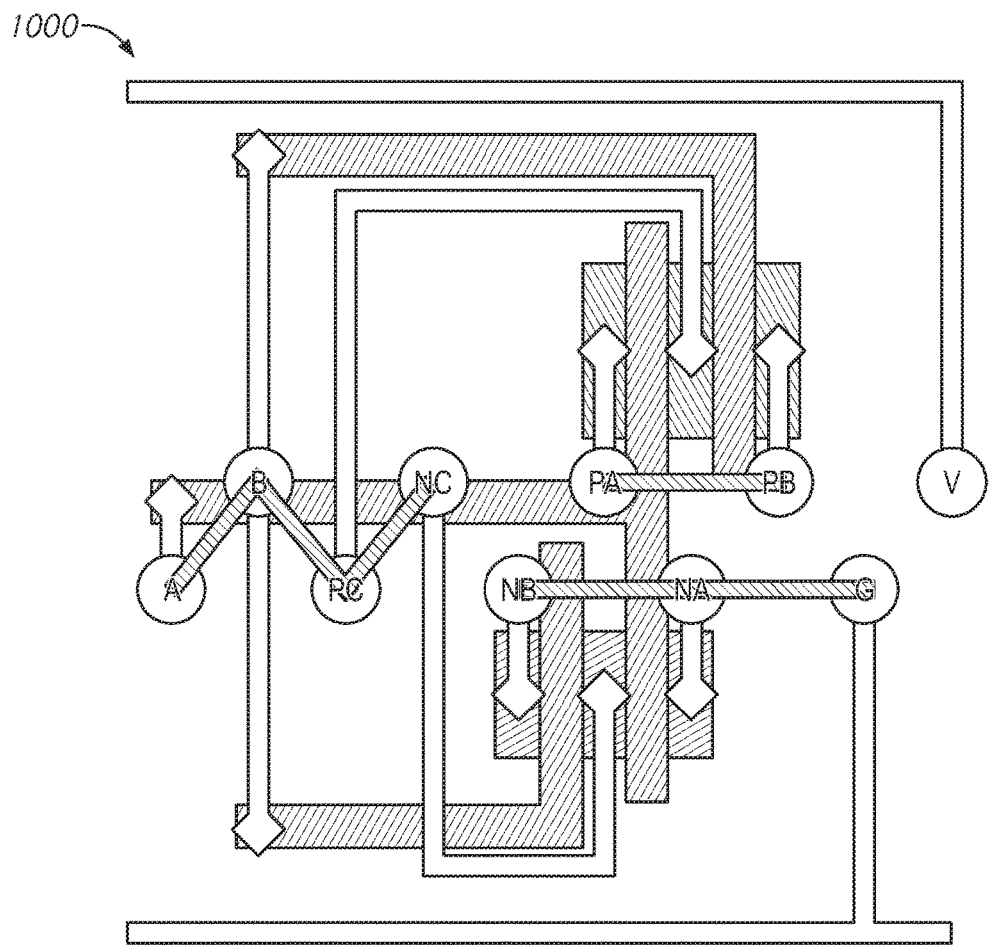
FIG. 10 is a layout diagram illustrating the configurable logic circuit configured to be disabled according to an embodiment of the disclosure.

A memory device may include one or more configurable logic circuits, such as configurable logic circuit 300. However, it may be determined that one or more of the configurable logic circuits are not required. Accordingly, the unused configurable logic circuits may be disabled. FIG. 10 is a layout diagram illustrating the configurable logic circuit 300 configured to be disabled 1000 according to an embodiment of the disclosure. To disable the logic circuit, second wiring layer 520 may couple node A, node B, node PC, and node NC together. Second wiring layer 520 may couple node PA and node PB together. Node NB and node NA may be coupled to ground at node G by second wiring layer 520.

Figure 11:
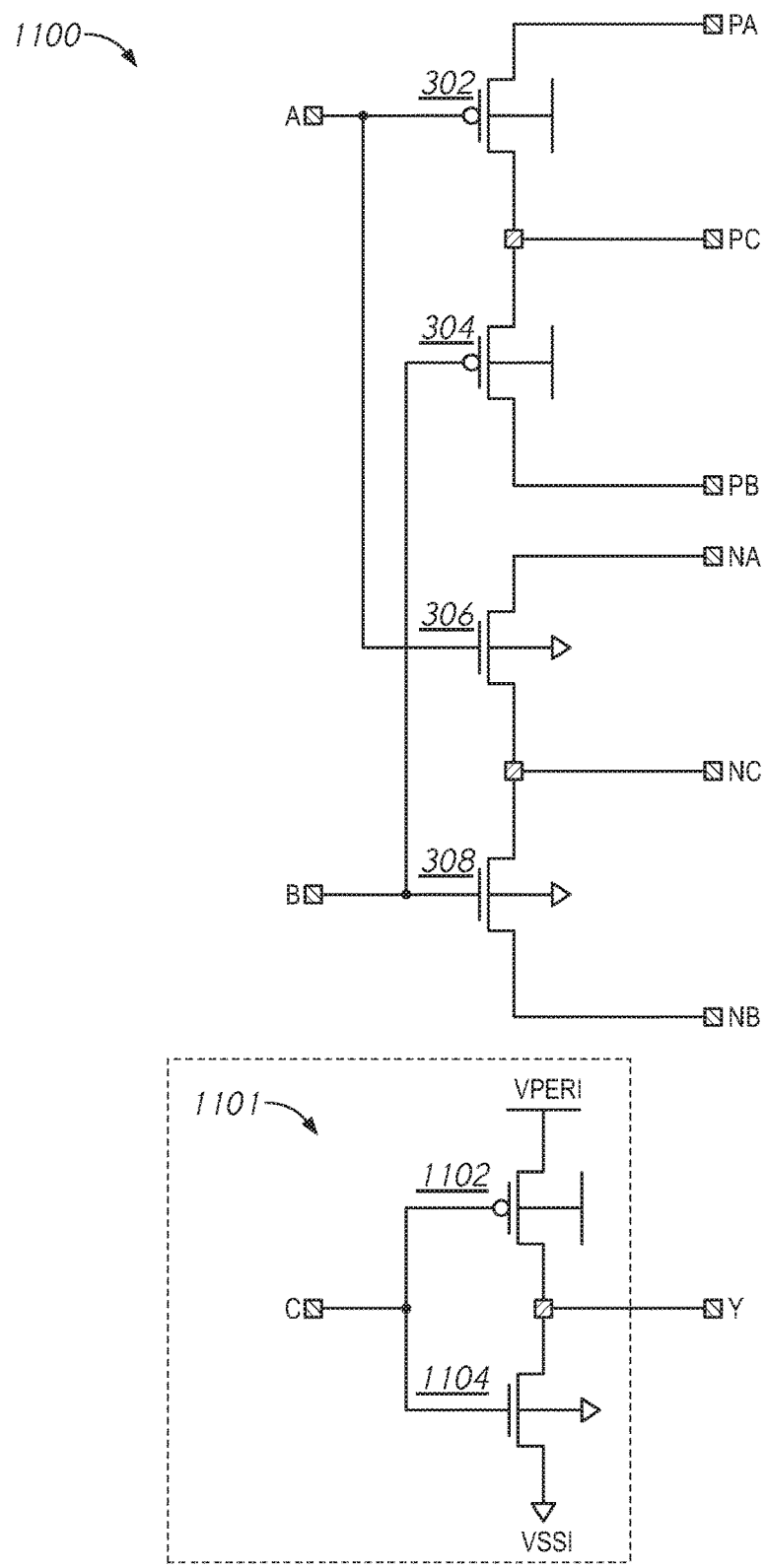
FIG. 11 is a circuit diagram of a configurable logic circuit according to an embodiment of the disclosure.

FIG. 11 is a circuit diagram of a configurable logic circuit 1100 according to an embodiment of the disclosure. Configurable logic circuit 1100 may include configurable logic circuit 300 and an additional inverter circuit 1101. Inverter circuit 1101 may include a third P-channel transistor 1102 and a third N-channel transistor 1104. Gates of the third P-channel transistor 1102 and the third N-channel transistor 1104 may be coupled to node C. Sources or drains of the third P-channel transistor 1102 and the third N-channel transistor 1104 may be coupled to node Y. The other of the source or drain of the third P-channel transistor 1102 may be coupled to a voltage source and the other of the source or drain of the third N-channel transistor 1104 may be coupled to a ground. Providing inverter circuit 1101 with configurable logic circuit 300 may allow configurable logic circuit 1100 to be configured to form one of an additional type of logic circuit or to form multiple logic circuits.

Figure 12:
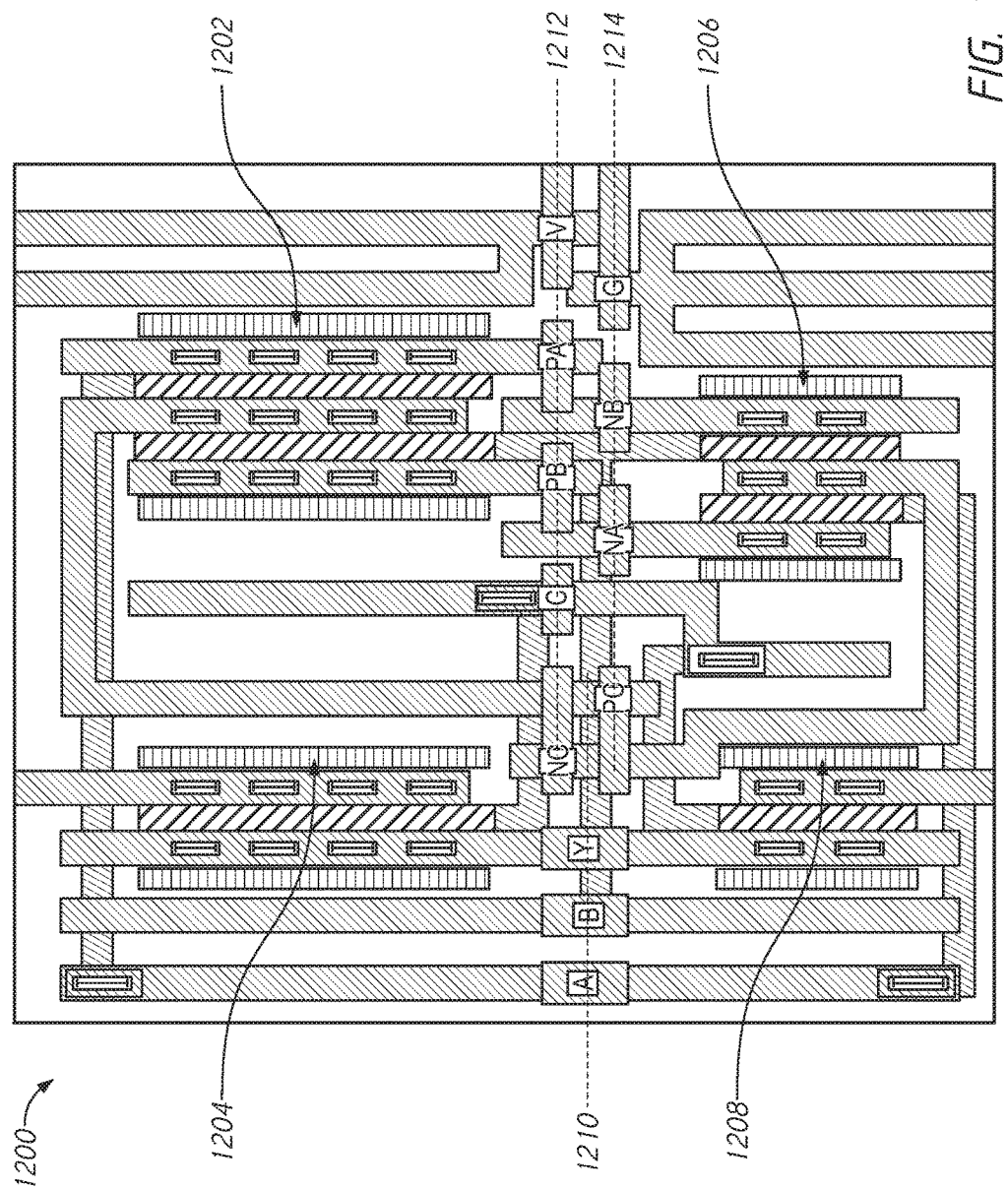
FIG. 12 is a layout diagram of the configurable logic circuit shown in FIG. 11 according to an embodiment of the disclosure.

FIG. 12 is a layout diagram 1200 of the configurable logic circuit 1100 according to an embodiment of the disclosure. The layout diagram 1200 illustrates how the configurable logic circuit 1100 may be arranged on a semiconductor die in some embodiments. Similar to what was shown in layout diagram 400 in FIG. 4, the configurable logic circuit 1100 may include a diffusion layer, a gate wiring layer, and a first wiring layer. The diffusion layer in configurable logic circuit 1100 may include two P-regions 1202, 1204 and two N-regions 1206, 1208. Node C may be coupled to P-region 1204 and N-region 1208 to couple the gates of third P-transistor 1102 and third N-transistor 1104. Node Y may be coupled to P-region 1204 and N-region 1208 adjacent to the connections node C to coupled drains of the third P-channel transistor 1102 and the third N-channel transistor 1104. Nodes A, B, PA, PC, PB, NA, NC, and NB may be coupled as described previously with reference to FIG. 4.

Some or all of the nodes may be arranged in one or more parallel lines. In the example shown in FIG. 12, nodes A, B, and Y are arranged along line 1210. Nodes NC, C, PB, and PA are arranged along line 1212. Nodes PC, NA, and PB are arranged along line 1214. In some embodiments, the wiring layer further includes a node V coupled to a voltage source (not shown). In the embodiment shown in FIG. 12, node V is arranged along line 1212. In some embodiments, the wiring layer further includes a node G coupled to a ground (not shown). In the embodiment shown in FIG. 12, node G is arranged along line 1214. In some embodiments, node A, node B, and/or node Y may be shifted to align with line 1212 or line 1214.

Similar to the layout of configurable logic circuit 300 shown in FIG. 4, the layout of configurable logic circuit 1100 shown in FIG. 12 may allow the configurable logic circuit 1100 to be configured as one or more logic circuits without crossing wires, which may allow modifying only one wiring layer.

The configurable logic circuit 300 and/or configurable logic circuit 1100 having the layouts illustrated in FIGS. 4 and 12, respectively, may be used to implement configurable logic circuit 225 of peripheral circuitry 215 shown in FIG. 2 in some embodiments. The peripheral circuitry 225 may be included in a memory device, such as semiconductor device 100 shown in FIG. 1. However, configurable logic circuits 300, 1100 may be used in other semiconductor devices, including, but not limited to, controllers and processors. The configurable logic circuits 300, 1100 may be configured to act as one or more of several types of logic circuits (e.g., NAND, NOR, MUX, etc.). This may allow adjustments to the device later in the design and/or manufacturing process in some applications. The configurable logic circuits 300, 1100 may be configured for a desired logic function without the need to re-design all masks for the fabrication process (e.g., diffusion layer mask, gate layer mask, etc.) in some embodiments. As described herein, the configurable logic circuits 300, 1100 may be configured by changing a single metal wiring pattern without multiple mask redesigns in some embodiments.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a diffusion layer including an N-region and a P-region;
    a gate wiring layer disposed adjacent to the diffusion layer, wherein the gate wiring layer includes:
        a first section having a T-shape, wherein at least a portion of a stem of the T-shape extends between the N-region and the P-region, at least a first portion of an arm of the T-shape extends over the N-region, and at least a second portion of the arm of the T-shape extends over the P-region;
        a second section having a first L-shape, wherein at least a portion of a stem of the first L-shape extends parallel to the stem of the T-shape and at least a portion of an arm of the first L-shape extends over the N-region parallel to the first portion of the arm of the T-shape, wherein the arm of the first L-shape is proximal to the stem of the T-shape; and
        a third section having a second L-shape, wherein at least a portion of a stem of the second L-shape extends parallel to the stem of the T-shape and at least a portion of an arm of the second L-shape extends over the P-region parallel to the second portion of the arm of the T-shape, wherein the arm of the second L-shape is distal to the stem of the T-shape; and
    a first wiring layer disposed adjacent to the gate wiring layer, wherein the gate wiring layer is disposed between the first wiring layer and the diffusion layer, wherein the first wiring layer includes:
        a first plurality of nodes; and
        a second plurality of nodes.

2. The apparatus of claim 1, wherein the first plurality of nodes comprises:
    a first node coupled to the stem of the first L-shape and the stem of the second L-shape;
    a second node coupled to the N-region between the stem of the first L-shape and the first portion of the arm of the T-shape;
    a third node coupled to the P-region adjacent to the second portion of the arm of the T-shape, the third node proximal to the stem of the T-shape; and
    a fourth node coupled to the P-region adjacent to the arm of the second L-shape, the fourth node distal to the stem of the T-shape.

3. The apparatus of claim 2, wherein the first plurality of nodes further comprises a fifth node configured to be coupled to a voltage source.

4. The apparatus of claim 1, wherein the first plurality of nodes comprises:
    a first node coupled to the stem of the first L-shape and the stem of the second L-shape;
    a second node coupled to the P-region between the stem of the second L-shape and the second portion of the arm of the T-shape;
    a third node coupled to the P-region adjacent to the second portion of the arm of the T-shape, the third node proximal to the stem of the T-shape; and
    a fourth node coupled to the P-region adjacent to the arm of the second L-shape, the fourth node distal to the stem of the T-shape.

5. The apparatus of claim 1, wherein the second plurality of nodes comprises:
    a first node coupled to the stem of the T-shape distal to the arm of the T-shape;
    a second node coupled to the P-region between the stem of the second L-shape and the second portion of the arm of the T-shape;
    a third node coupled to the N-region adjacent to the arm of the first L-shape, the third node proximal to the stem of the T-shape; and
    a fourth node coupled to the N-region adjacent to the first portion of the arm of the T-shape, the fourth node distal to the stem of the T-shape.

6. The apparatus of claim 5, wherein the second plurality of nodes further includes a fifth node configured to be coupled to a ground.

7. The apparatus of claim 1, wherein the second plurality of nodes comprises:
    a first node coupled to the stem of the T-shape distal to the arm of the T-shape;
    a second node coupled to the N-region between the stem of the first L-shape and the first portion of the arm of the T-shape;
    a third node coupled to the N-region adjacent to the arm of the first L-shape, the third node proximal to the stem of the T-shape; and a fourth node coupled to the N-region adjacent to the first portion of the arm of the T-shape, the fourth node distal to the stem of the T-shape.

8. The apparatus of claim 1, further comprising a second wiring layer, wherein the second wiring layer may be coupled to a combination of nodes comprising nodes from the first plurality of nodes and the second plurality of nodes.

9. The apparatus of claim 8, wherein the combination of nodes coupled by the second wiring layer forms an inverter circuit, a NAND circuit, a NOR circuit, a multiplexer circuit, or a disabled circuit.

* * * * *